United States Patent
Goddard et al.

(10) Patent No.: US 9,028,715 B2
(45) Date of Patent: May 12, 2015

(54) COMPOSITIONS AND METHODS FOR MANUFACTURING LIGHT-EMISSIVE DEVICES

(75) Inventors: Simon Goddard, Impington (GB); Paul Wallace, Royston (GB)

(73) Assignee: Cambridge Display Technology Limited, Cambridgeshire (GB)

( * ) Notice: Subject to any disclaimer, the term of this patent is extended or adjusted under 35 U.S.C. 154(b) by 914 days.

(21) Appl. No.: 13/054,437

(22) PCT Filed: Jul. 20, 2009

(86) PCT No.: PCT/GB2009/001801
§ 371 (c)(1), (2), (4) Date: Mar. 29, 2011

(87) PCT Pub. No.: WO2010/010337
PCT Pub. Date: Jan. 28, 2010

(65) Prior Publication Data
US 2011/0269255 A1  Nov. 3, 2011

(30) Foreign Application Priority Data
Jul. 21, 2008  (GB) .................. 0813348.0

(51) Int. Cl.
*C09K 11/06*  (2006.01)
*H01L 51/00*  (2006.01)

(52) U.S. Cl.
CPC ........ *H01L 51/0007* (2013.01); *H01L 51/0022* (2013.01); *H01L 51/0034* (2013.01); *H01L 51/0085* (2013.01)

(58) Field of Classification Search
USPC .......... 252/301.16, 301.33, 301.36; 313/483, 313/504, 506, 503; 428/690
See application file for complete search history.

(56) References Cited

U.S. PATENT DOCUMENTS

| | | | |
|---|---|---|---|
| 1,424,350 A | 8/1922 | Gale | |
| 4,539,507 A | 9/1985 | VanSlyke et al. | |

(Continued)

FOREIGN PATENT DOCUMENTS

| | | |
|---|---|---|
| EP | 0707020 | 4/1996 |
| EP | 0842208 A1 | 5/1998 |

(Continued)

OTHER PUBLICATIONS

International Search Report and Written Opinion for PCT/GB2009/001801 dated Jul. 20, 2009.

(Continued)

*Primary Examiner* — Carol M Koslow
*Assistant Examiner* — Lynne Edmondson
(74) *Attorney, Agent, or Firm* — Marshall, Gerstein & Borun LLP

(57) ABSTRACT

A composition adapted for use in the manufacture of an organic light-emissive device by passing the composition through one or more openings under pressure to deposit the composition, the composition comprising: a semi-conductive organic host material; a luminescent metal complex; and a first solvent, wherein the first solvent has a structure:

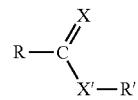

where X, X' independently comprise O, S or N and R, R' independently comprise an aromatic or aliphatic group.

24 Claims, 4 Drawing Sheets

(56) References Cited

U.S. PATENT DOCUMENTS

| | | | |
|---|---|---|---|
| 5,150,006 | A | 9/1992 | Van Slyke et al. |
| 5,432,014 | A | 7/1995 | Sano et al. |
| 5,621,069 | A * | 4/1997 | Galvin-Donoghue et al. ............................ 528/379 |
| 5,723,873 | A | 3/1998 | Yang |
| 5,798,170 | A | 8/1998 | Zhang et al. |
| 6,083,634 | A | 7/2000 | Shi |
| 6,268,695 | B1 | 7/2001 | Affinito |
| 6,353,083 | B1 | 3/2002 | Inbasekaran et al. |
| 6,878,312 | B1 | 4/2005 | Kanbe et al. |
| 6,953,628 | B2 | 10/2005 | Kamatani et al. |
| 7,030,138 | B2 | 4/2006 | Fujimoto et al. |
| 7,125,998 | B2 | 10/2006 | Stossel et al. |
| 7,238,435 | B2 | 7/2007 | Kamatani et al. |
| 7,544,426 | B2 | 6/2009 | Kamatani et al. |
| 2002/0117662 | A1 | 8/2002 | Nii |
| 2002/0182441 | A1 | 12/2002 | Lamansky et al. |
| 2003/0091862 | A1 * | 5/2003 | Tokito et al. .................. 428/690 |
| 2005/0031900 | A1 * | 2/2005 | Yu et al. ........................ 428/690 |
| 2006/0045959 | A1 | 3/2006 | Yasukawa et al. |
| 2006/0094859 | A1 * | 5/2006 | Marrocco et al. ............. 528/394 |
| 2006/0182993 | A1 | 8/2006 | Ogata et al. |
| 2006/0199943 | A1 | 9/2006 | Falcou et al. |
| 2006/0269657 | A1 | 11/2006 | Shimizu et al. |
| 2007/0181944 | A1 * | 8/2007 | Macpherson et al. ......... 257/344 |
| 2007/0278945 | A1 * | 12/2007 | Abe et al. ....................... 313/506 |
| 2008/0265214 | A1 * | 10/2008 | Steiger et al. .................. 252/500 |
| 2009/0284134 | A1 * | 11/2009 | Iida et al. ....................... 313/504 |
| 2010/0301310 | A1 * | 12/2010 | Noguchi et al. ................. 257/40 |

FOREIGN PATENT DOCUMENTS

| | | |
|---|---|---|
| EP | 0880303 A1 | 11/1998 |
| EP | 0901176 A2 | 3/1999 |
| EP | 0947123 | 10/1999 |
| EP | 0949850 A1 | 10/1999 |
| EP | 0989778 | 3/2000 |
| EP | 1245659 | 10/2002 |
| EP | 1311138 A1 * | 5/2003 |
| EP | 1894976 A1 | 3/2008 |
| EP | 1 921 112 A1 | 5/2008 |
| GB | 0801227 A | 9/1958 |
| GB | 2348316 A | 9/2000 |
| GB | 2 421 242 A | 6/2006 |
| JP | 2002-324679 A | 11/2002 |
| JP | 200232467 | 11/2002 |
| JP | 2006-066294 A | 3/2006 |
| JP | 2006-332406 A | 12/2006 |
| JP | 2007176930 A * | 7/2007 |
| JP | 2007-525564 A | 9/2007 |
| WO | WO-9013148 | 11/1990 |
| WO | WO-9506400 | 3/1995 |
| WO | WO-9810621 A1 | 3/1998 |
| WO | WO-9857381 | 12/1998 |
| WO | WO-9921935 A1 | 5/1999 |
| WO | WO-9948160 A1 | 9/1999 |
| WO | WO-0048258 A1 | 8/2000 |
| WO | WO-0053656 A1 | 9/2000 |
| WO | WO-0055927 A1 | 9/2000 |
| WO | WO-0059267 A1 | 10/2000 |
| WO | WO-0116251 A1 | 3/2001 |
| WO | WO-0119142 A1 | 3/2001 |
| WO | WO 0162869 A1 | 8/2001 |
| WO | WO 0181649 A1 | 11/2001 |
| WO | WO-0218513 | 3/2002 |
| WO | WO-0231896 A2 | 4/2002 |
| WO | WO-0244189 A1 | 6/2002 |
| WO | WO-0245466 A1 | 6/2002 |
| WO | WO-02066552 | 8/2002 |
| WO | WO-02067343 | 8/2002 |
| WO | WO-02068435 | 9/2002 |
| WO | WO-02081448 | 10/2002 |
| WO | WO-02084759 A1 | 10/2002 |
| WO | WO-03018653 A1 | 3/2003 |
| WO | WO-03022908 | 3/2003 |
| WO | WO-03065474 A1 | 8/2003 |
| WO | WO-03083960 | 10/2003 |
| WO | WO 2005112145 A1 * | 11/2005 |
| WO | WO-2008/043979 A1 | 4/2008 |

OTHER PUBLICATIONS

Jiang et al., "High-Efficiency White-Light-Emitting Devices from a Single Polymer by Mixing Singlet and Triplet Emission," *Advanced Materials*, 18:1769-1773 (2006).

Kim et al., "White-Light-Emitting Diodes Based on Iridium Complexes via Efficient Energy Transfer from a Conjugated Polymer," *Advanced Functional Materials*, 16:611-617 (2006).

Zhen et al., "Synthesis and Properties of Electrophosphorescent Chelating Polymers with Iridium Complexes in the Conjugated Backbone," *Chemistry Eur, J.*, 11:5007-5017 (2005).

Baldo et al., "Very High-Efficiency Green Organic Light-Emitting Devices Based on Electrophosphorescence," *Appl. Phys. Lett.* 75(1):4-6 (1999).

Bernius et al., "Progress with Light-Emitting Polymers", *Adv. Mater.*, 12(23):1737-1750 (2000).

Chen et al., "Recent Developments in Molecular Organic Electroluminescent Materials," *Macromol. Sym.*, 125:1-48 (1997).

Chen et al., "Triplet Exciton Confinement in Phosphorescent Polymer Light-Emitting Diodes," *Appl. Phys. Lett.*, 82(7):1006-1008 (2003).

Cleave et al., "Harvesting Singlet and Triplet Energy in Polymer LEDs," *Adv. Mater.*, 11(4):285-288 (1999).

Deegan et al., "Capillary Flow as the Cause of Ring Stains from Dried Liquid Drops," *Nature*, 389:827-829 (1997).

Duineveld et al., "Ink-Jet Printing of Polymer Light-Emitting Devices," *Proceedings of SPIE* vol. 4464 , p. 59-67 (2002).

Hebner et al., "Ink-Jet Printing of Doped Polymers of Organic Light Emitting Devices," *Appl. Phys. Lett.*, 72:519-521 (1998).

Lane et al., "Origin of Electrophosphorescence From a Doped Polymer Light Emitting Diode," *Phys. Rev. B*, 63:235206-1-235206-8 (2001).

Lee et al., "Polymer Phosphorescent Light-Emitting Devices Doped with Tris(2-phenylpyridine) Iridium as a Triplet Emitter," *Appl. Phys. Lett.*, 77(15):2280-2282 (2000).

Michaelson, "The work function of the elements and its periodicity", *J. Applied Physics*, 48(11): 4729-4733 (1977).

Niu et al., "Thermal annealing below the glass transition temperature: A general way to increase performance of light-emitting diodes based on copolyfluorenes", *Applied Physics Letters*, 81 (4):634-636 (2002).

O'Brien et al., "Electrophosphorescence From a Doped Polymer Light Emitting Diode," *Synth. Met.*, 116:379-383 (2001).

Setayesh et al., "Bridging the Gap between Polyfluorene and Ladder-Poly-*p*-phenylene: Synthesis and Characterization of Poly-2,8-indenofluorene", *Macromolecules*, 33:2016-2020 (2000).

Tokito et al., "Metal oxides as a hole-injecting layer for an organic electroluminescent device", *J. Phys. D: Appl. Phys.*, 29:2750-2753 (1996).

Yamaguchi et al., "Effects of B and C on the ordering of $L1_0$-CoPt thin films", *Applied Physics Letters*, 79(13):2001-2003 (2001).

Yamamoto, "Electrically Conducting and Thermally Stable π-Conjugated Poly (Arylene)s Prepared by Organometallic Processes", *Polymer Science*, 17:1153-1205 (1993).

Yang et al., "Efficient blue polymer light-emitting diodes from a series of soluble poly(paraphenylene)s", *J. Appl. Phys.*, 79(2):934-939 (1996).

Yang, "Review of Recent Progress on Polymer Electroluminescent Devices," *SPIE Photonics West: Optoelectronics '98*, Conf. 3279, San Jose (1998).

Zhu et al., "Synthesis of New Iridium Complexes and Their Electrophosphorescent Properties in Polymer Light-Emitting Diodes," *J. Mater. Chem.*, 13:50-55 (2003).

Combined Search and Examination Report for Application No. GB0813348.0, dated Nov. 28, 2008.

International Preliminary Report on Patentability for Application No. PCT/GB2009/001801, dated Jan. 25, 2011.

* cited by examiner

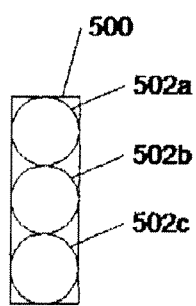
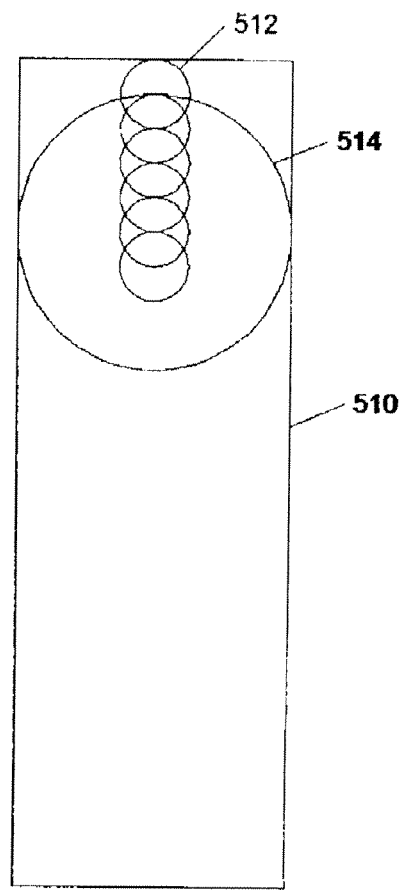
Figure 5a
Figure 5b

COMPOSITIONS AND METHODS FOR MANUFACTURING LIGHT-EMISSIVE DEVICES

FIELD OF INVENTION

This invention relates to compositions for manufacturing light-emissive devices and uses of said compositions in methods of manufacturing light-emissive devices.

BACKGROUND OF INVENTION

One class of opto-electrical devices is that using an organic material for light emission (or detection in the case of photovoltaic cells and the like). The basic structure of these devices is a light emissive organic layer, for instance a film of a poly (p-phenylenevinylene) ("PPV") or polyfluorene, sandwiched between a cathode for injecting negative charge carriers (electrons) and an anode for injecting positive charge carriers (holes) into the organic layer. The electrons and holes combine in the organic layer generating photons. In WO90/13148 the organic light-emissive material is a polymer. In U.S. Pat. No. 4,539,507 the organic light-emissive material is of the class known as small molecule materials, such as (8-hydroxyquinoline) aluminum ("Alq3"). In a practical device one of the electrodes is transparent, to allow the photons to escape the device.

A typical organic light-emissive device ("OLED") is fabricated on a glass or plastic substrate coated with a transparent anode such as indium-tin-oxide ("ITO"). A layer of a thin film of at least one electroluminescent organic material covers the first electrode. Finally, a cathode covers the layer of electroluminescent organic material. The cathode is typically a metal or alloy and may comprise a single layer, such as aluminum, or a plurality of layers such as calcium and aluminum.

In operation, holes are injected into the device through the anode and electrons are injected into the device through the cathode. The holes and electrons combine in the organic electroluminescent layer to form an exciton which then undergoes radiative decay to give light (in light detecting devices this process essentially runs in reverse).

OLEDs can provide a particularly advantageous form of electro-optic display. They are bright, colorful, fast-switching, provide a wide viewing angle and are easy and cheap to fabricate on a variety of substrates. Organic (which here includes organometallic) LEDs may be fabricated using polymers, dendrimers, and/or small molecules in a range of colors, depending upon the materials used.

OLEDs may be deposited on a substrate in a matrix of pixels to form a single or multi-color pixelated display. A multi-colored display may be constructed using groups of red, green, and blue emitting pixels. So-called active matrix displays have a memory element, typically a storage capacitor and a transistor, associated with each pixel whilst passive matrix displays have no such memory element and instead are repetitively scanned to give the impression of a steady image.

FIG. 1 shows a vertical cross section through an example of an OLED device 100. In an active matrix display, part of the area of a pixel is occupied by associated drive circuitry (not shown in FIG. 1). The structure of the device is somewhat simplified for the purposes of illustration.

The OLED 100 comprises a substrate 102, typically 0.7 mm or 1.1 mm glass but optionally clear plastic, on which an anode layer 106 has been deposited. The anode layer typically comprises around 150 nm thickness of ITO (indium tin oxide), over which is provided a metal contact layer, typically around 500 nm of aluminum, sometimes referred to as anode metal. Glass substrates coated with ITO and contact metal may be purchased from Corning, USA. The contact metal (and optionally the ITO) is patterned as desired so that it does not obscure the display, by a conventional process of photolithography followed by etching.

A substantially transparent hole transport layer 108a is provided over the anode metal, followed by an electroluminescent layer 108b. Banks 112 may be formed on the substrate, for example from positive or negative photoresist material, to define wells 114 into which these active organic layers may be selectively deposited, for example by a droplet deposition or inkjet printing technique. The wells thus define light emitting areas or pixels of the display.

A cathode layer 110 is then applied by, say, physical vapor deposition. The cathode layer typically comprises a low work function metal such as calcium or barium covered with a thicker, capping layer of aluminum and optionally including an additional layer immediately adjacent the electroluminescent layer, such as a layer of lithium fluoride, for improved electron energy level matching. The cathode may be transparent. This is particularly preferred for active matrix devices wherein emission through the substrate is partially blocked by drive circuitry located underneath the emissive pixels. In the case of a transparent cathode device, it will be appreciated that the anode is not necessarily transparent. In the case of passive matrix displays, mutual electrical isolation of cathode lines may achieved through the use of cathode separators (element 302 of FIG. 3b). Typically a number of displays are fabricated on a single substrate and at the end of the fabrication process the substrate is scribed, and the displays separated. An encapsulant such as a glass sheet or a metal can is utilized to inhibit oxidation and moisture ingress.

OLEDs of this general type may be fabricated using a range of materials including polymers, dendrimers, and so-called small molecules, to emit over a range of wavelengths at varying drive voltages and efficiencies. Examples of polymer-based OLED materials are described in WO 90/13148, WO 95/06400 and WO 99/48160; examples of dendrimer-based materials are described in WO 99/21935 and WO 02/067343; and examples of small molecule OLED materials are described in U.S. Pat. No. 4,539,507. The aforementioned polymers, dendrimers and small molecules emit light by radiative decay of singlet excitons (fluorescence). However, up to 75% of excitons are triplet excitons which normally undergo non-radiative decay. Electroluminescence by radiative decay of triplet excitons (phosphorescence) is disclosed in, for example, "Very high-efficiency green organic light-emitting devices based on electrophosphorescence" M. A. Baldo, S. Lamansky, P. E. Burrows, M. E. Thompson, and S. R. Forrest *Applied Physics Letters*, Vol. 75(1) pp. 4-6, Jul. 5, 1999". In the case of a polymer-based OLED, layers 108 comprise a hole injection layer 108a and a light emitting polymer (LEP) electroluminescent layer 108b. The electroluminescent layer may comprise, for example, around 70 nm (dry) thickness of PPV (poly(p-phenylenevinylene)) and the hole injection layer, which helps match the hole energy levels of the anode layer and of the electroluminescent layer, may comprise, for example, around 50-200 nm, preferably around 150 nm (dry) thickness of PEDOT:PSS (polystyrene-sulphonate-doped polyethylene-dioxythiophene).

FIG. 2 shows a view from above (that is, not through the substrate) of a portion of a three-color active matrix pixelated OLED display 200 after deposition of one of the active color layers. The figure shows an array of banks 112 and wells 114 defining pixels of the display.

FIG. 3a shows a view from above of a substrate 300 for inkjet printing a passive matrix OLED display. FIG. 3b shows a cross-section through the substrate of FIG. 3a along line Y-Y'.

Referring to FIGS. 3a and 3b, the substrate is provided with a plurality of cathode undercut separators 302 to separate adjacent cathode lines (which will be deposited in regions 304). A plurality of wells 308 is defined by banks 310, constructed around the perimeter of each well 308 and leaving an anode layer 306 exposed at the base of the well. The edges or faces of the banks are tapered onto the surface of the substrate as shown, heretofore at an angle of between 10 and 40 degrees. The banks present a hydrophobic surface in order that they are not wetted by the solution of deposited organic material and thus assist in containing the deposited material within a well. This may be achieved by treatment of a bank material such as polyimide with an O2/CF4 plasma as disclosed in EP 0989778. Alternatively, the plasma treatment step may be avoided by use of a fluorinated material such as a fluorinated polyimide as disclosed in WO 03/083960.

As previously mentioned, the bank and separator structures may be formed from resist material, for example using a positive (or negative) resist for the banks and a negative (or positive) resist for the separators; both these resists may be based upon polyimide and spin coated onto the substrate, or a fluorinated or fluorinated-like photoresist may be employed. In the example shown the cathode separators are around 5 μm in height and approximately 20 μm wide. Banks are generally between 20 μm and 100 μm in width and in the example shown have a 4 μm taper at each edge (so that the banks are around 1 μm in height). The pixels of FIG. 3a are approximately 300 μm square but, as described later, the size of a pixel can vary considerably, depending upon the intended application.

The deposition of material for organic light emitting diodes (OLEDs) using ink jet printing techniques is described in a number of documents including, for example: T. R. Hebner, C. C. Wu, D. Marcy, M. H. Lu and J. C. Sturm, "Ink-jet Printing of doped Polymers for Organic Light Emitting Devices", Applied Physics Letters, Vol. 72, No. 5, pp. 519-521, 1998; Y. Yang, "Review of Recent Progress on Polymer Electroluminescent Devices," *SPIE Photonics West: Optoelectronics* '98, Conf. 3279, San Jose, January, 1998; EP 0 880 303; and "Ink-Jet Printing of Polymer Light-Emitting Devices", Paul C. Duineveld, Margreet M. de Kok, Michael Buechel, Aad H. Sempel, Kees A. H. Mutsaers, Peter van de Weijer, Ivo G. J. Camps, Ton J. M. van den Biggelaar, Jan-Eric J. M. Rubingh and Eliav I. Haskal, Organic Light-Emitting Materials and Devices V, Zakya H. Kafafi, Editor, Proceedings of SPIE Vol. 4464 (2002). Ink jet techniques can be used to deposit materials for both small molecule and polymer LEDs.

A volatile solvent is generally employed to deposit a molecular electronic material, with 0.5% to 4% dissolved material. This can take anything between a few seconds and a few minutes to dry and results in a relatively thin film in comparison with the initial "ink" volume. Often multiple drops are deposited, preferably before drying begins, to provide sufficient thickness of dry material. Typical solvents which have been used include cyclohexylbenzene and alkylated benzenes, in particular toluene or xylene; others are described in WO 00/59267, WO 01/16251 and WO 02/18513; a solvent comprising a blend of these may also be employed. Precision ink jet printers such as machines from Litrex Corporation of California, USA are used; suitable print heads are available from Xaar of Cambridge, UK and Spectra, Inc. of NH, USA.

The last few years have seen an increasing activity in the development of ink jet printing for depositing electronic materials. In particular there have been demonstrations of ink jet printing of charge injection, charge transport and electroluminescent layers of OLED devices by more than a dozen display manufacturers.

The key reasons for the interest in ink jet printing are scalability and adaptability. The former allows arbitrarily large sized substrates to be patterned and the latter should mean that there are negligible tooling costs associated with changing from one product to another since the image of dots printed on a substrate is defined by software. At first sight this would be similar to printing a graphic image—commercial print equipment is available that allow printing of arbitrary images on billboard sized substrates [Inca digital website: http://www.incadigital.com/]. However the significant difference between graphics printers and display panels is that the former use substrates that are porous or use inks that are UV curable resulting in very little effect of the drying environment on film formation. In comparison, the inks used in fabricating OLED displays are ink jet printed onto non-porous surfaces and the process of changing from a wet ink to dry film is dominated by the drying environment of the ink in the pixel. In addition OLED devices require the films to be uniform to nanometer tolerance. It follows that to achieve scalability and adaptability requires control of the film forming properties of the ink and a robustness of this process to changes in pixel dimensions and swathe timing.

The aforementioned control is far from a simple matter as the physics of the interactions of a drying solution with a surface are extremely complicated and a complete theory still awaits development. In general terms, the behavior of drying drops of ink is explained by the coffee-ring effect first modeled by Deegan [R. D. Deegan, O. Bakajin, T. F. Dupont, G. Huber, S. R. Nagel, and T. A. Witten. Capillary flow as the cause of ring stains from dried liquid drops. Nature 389, 827 (1997)]. For the case of circular pixels the wet ink forms a section of a sphere, where the angle made by the drop surface with the substrate is the contact angle. When pinning occurs (which it invariably does for the inks and surfaces used in polymer OLED display manufacturing) the drying drop maintains its diameter and solute is carried to the edges of the drop forming a ring of material at the outer edges of the pixel. The amount of material carried to the edge depends on a number of factors—in particular how long the process of material transfer can occur before the drying drop gels and the uniformity of the drying environment.

In some circumstance, the dissolved molecular electronic material deposited into a well may dry to form a film with a relatively thin edge. FIGS. 4a and 4b illustrate this process. FIG. 4a shows a simplified cross section 400 through a well 308 filled with dissolved material 402, and FIG. 4b shows the same well after the material has dried to form a solid film 404. In this example the bank angle is approximately 15° and the bank height is approximately 1.5 μm. As can be seen a well is generally filled until it is brimming over. The solution 402 has a contact angle $\theta_c$ with the plasma treated bank material of typically between 30° and 40° for example around 35°; this is the angle the surface of the dissolved material 402 makes with the (bank) material it contacts, for example angle 402a in FIG. 4a. As the solvent evaporates the solution becomes more concentrated and the surface of the solution moves down the tapering face of a bank towards the substrate; pinning of the drying edge can occur at a point between the initially landed wet edge and the foot of the bank (base of the well) on the substrate. The result, shown in FIG. 4b, is that the film of dry material 404 can be very thin, for example of the order of 10 nm or less, in a region 404a where it meets the face of a bank.

In other circumstance, due to the coffee ring effect the dissolved molecular electronic material deposited into a well may dry to form a film with a relatively thick edge. Because the thickness of solution is less at the edge of a drop than in the center, as the edge dries the concentration of dissolved material there increases. Because the edge tends to be pinned solution then flows from the centre of the drop towards the edge to reduce the concentration gradient. This effect can result in dissolved material tending to be deposited in a ring rather than uniformly.

In addition to the above problems, since the printing process involves printing stripes (or swathes) of ink (corresponding to the ink jet head width) there is an inbuilt asymmetry in the drying environment. At a swathe edge more drying occurs on the unprinted side since the solvent concentration in the atmosphere above the substrate is less than the printed side. With more evaporation taking place on the unprinted side more solute is deposited on this side and the film profile becomes asymmetric.

Yet another problem is that an inkjet droplet may not fall exactly into a well but instead land in part on the slope of the bank and may dry in place, resulting in non-uniformities in the end display.

A further problem with inkjet deposition arises when filling wells which are large compared with the size of an inkjet droplet. A typical droplet from an inkjet print head has a diameter of approximately of 30 µm in flight and the droplet grows to approximately 100 µm in diameter when it lands and wets out. However it is difficult to produce drops of, say 100 µm in diameter (in flight) from a print head. As such, several droplets may be required to fill a large well. FIG. 5a which shows a well 500 for a long thin pixel of a type which is typically used in a RGB (red green blue) display. In the example of FIG. 5a the pixel has a width of 50 µm and a length of 150 µm with 20 µm wide banks (giving a 70 µm pixel pitch and a 210 µm full color pitch). Such a well can be filled by three 50 µm droplets 502a, b, c as shown. Referring now to FIG. 5b this shows a well 510 for a pixel which is approximately four times larger than each dimension giving a pixel width of approximately 200 µm, more suitable for applications such as a color television. As can be seen from the figure, many droplets 512 are needed to fill such a pixel. In practice, these tend to coalesce to form a larger droplet 514 which tends not to properly fill corners of the pixel (although FIGS. 5a and 5b are idealized and, in practice, the corners are not generally as sharp as they are shown). One way around this problem is to over fill the well to a sufficient extent that the dissolved material well is pushed into the corners. This can be achieved by using a large number of dilute droplets and a high barrier around the well. Techniques for depositing large volumes of liquid are described in WO 03/065474, which describes the use of very high barriers (for examples at page 8 lines 8 to 20) to allow the wells to hold a large volume of liquid without the liquid overflowing to adjacent wells. However such structures cannot easily be formed by photolithography and instead a plastic substrate is embossed or injection molded. It is also desirable to be able to fill a well using fewer (higher concentration) droplets as this enables, inter alia faster printing.

It is evident from the above discussion that there are various problems associated with inkjet printing organic materials for manufacturing OLEDs.

It is an aim of embodiments of the present invention to solve, or at least reduce, one or more of the problems outlined above by adapting compositions for ink jet printing organic light-emissive materials for light-emissive devices.

While the aforementioned discussion has been directed at inkjet printing it should be noted that at least some of these problems may occur when using any deposition technique which involves passing a composition through one or more openings under pressure to deposit the composition. Examples of such deposition techniques include inkjet printing, nozzle printing and spray coating.

SUMMARY OF THE PRESENT INVENTION

In addition to the problems of depositing prior art compositions using inkjet printing, it has been found by the present applicant that certain organic light-emissive materials are particularly difficult to deposit effectively using inkjet printing type techniques. In particular, the present applicant has found that compositions comprising a semi-conductive organic host material and a luminescent metal complex can give poor printing performance using standard solvents. For example, the use of standard solvents for such compositions has been found to give very poor drop directionality. Accordingly, the present applicant has sought to develop solvent systems specifically adapted for printing such compositions.

According to a first aspect of the present invention there is provided a composition adapted for use in the manufacture of an organic light-emissive device by passing the composition through one or more openings under pressure to deposit the composition, the composition comprising: a semi-conductive organic host material; a luminescent metal complex; and a first solvent, wherein the first solvent has a structure:

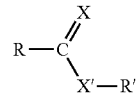

where X, X' independently comprise O, S or N and R, R' independently comprise an aromatic or aliphatic group.

It has been found by the present applicant that use of a solvent system comprising the aforementioned solvent allows materials comprising a semi-conductive organic host material and a luminescent metal complex to be jetted with better directionality compared to other commonly used inkjet solvents.

According to certain embodiments the semi-conductive organic host material is a semi-conductive polymer. It has been found that the solvent system of the present invention is particularly useful for printing polymer compositions comprising a luminescent metal complex. These compositions have been found to give particularly poor jetting directionality using standard solvent systems.

The first solvent preferably has a boiling point in the range 100° C. to 300° C. Solvents falling within this range of boiling points give better drying characteristics after being deposited by a jetting technique.

According to certain embodiments X and X' may both be oxygen. R may be an aromatic group and R' may be an aliphatic group. For example, the first solvent may be a benzoate such as methyl benzoate or butyl benzoate.

Advantageously, the composition comprises a second solvent different from the first solvent. The second solvent may also have a structure as defined previously in relation to the first solvent. The provision of two such solvents allows the physical and chemical properties of the solvent system to be fine tuned for a particular semi-conductive organic host/luminescent metal complex composition.

A third solvent different from the first and, if present, second solvent may also be provided in the solvent system. The third solvent can allow the solvent system to be fine tuned according to the well size and shape and according to the wettability of the materials used to form the wells in order to control the wetting and drying characteristics of the composition after deposition in the wells.

It may be desirable to provide a third solvent which has a lower boiling point to act as a carrier solvent which evaporates off quickly after the composition is deposited in the wells. Examples of such solvents include alkylbenzenes and alkoxybenzenes such methylanisole.

According to certain embodiments the luminescent metal complex is a transition metal complex such as an iridium complex. The luminescent metal complex may be phosphorescent. Embodiments of the present invention have been found to be particularly useful for compositions comprising a red phosphorescent iridium complex.

The luminescent metal complex may be bonded to the semi-conductive organic host or mixed with the semi-conductive organic host in a blend. Furthermore, the semi-conductive organic host may comprise one or more emissive units having a different color to the luminescent metal complex. These units may be fluorescent. For example, embodiments of the present invention have been found to be particularly useful for white emissive compositions comprising a green fluorescent unit, a blue fluorescent unit and a phosphorescent red emissive metal complex.

The composition preferably comprises a total solid content in the range 0.001 to 5% by weight, more preferably 0.6 to 1.4% by weight. The total solid content preferably comprises 0.001 to 50% by weight of the luminescent metal complex, more preferably 0.001 to 30% by weight, most preferably 0.001 to 20% by weight. Furthermore, the composition preferably has a viscosity in the range 1 to 20 cP, more preferably 3 to 10 cP. The composition also preferably has a surface tension in the range 28 to 40 mNm$^{-1}$, more preferably in the range 30 to 35 mNm$^{-1}$. The semi-conductive organic host preferably has a molecular weight in the range 250,000 to 350,000 Daltons. Compositions with these parameters have been found to give the best jetting performance.

According to a second aspect of the present invention there is provided a method of manufacturing a light-emissive device, the method comprising: depositing a first electrode for injecting charge of a first polarity; depositing a light-emissive layer; and depositing a second electrode for injecting charge of a second polarity opposite to said first polarity, wherein the light-emissive layer is deposited by passing the composition according to any preceding claim through one or more openings under pressure. The composition may be deposited by ink-jet printing, nozzle printing, or spray coating, preferably inkjet printing. The jetting frequency is preferably in the range 500 Hz to 10 KHz, more preferably 4 to 6 KHz. It has been found that these jetting frequencies give better directionality.

BRIEF SUMMARY OF THE DRAWINGS

FIGS. 5a and 5b show examples of filling a small pixel and a large pixel respectively with droplets of dissolved OLED material.

DETAILED DESCRIPTION OF PREFERRED EMBODIMENTS

General Device Architecture

Figure 1:
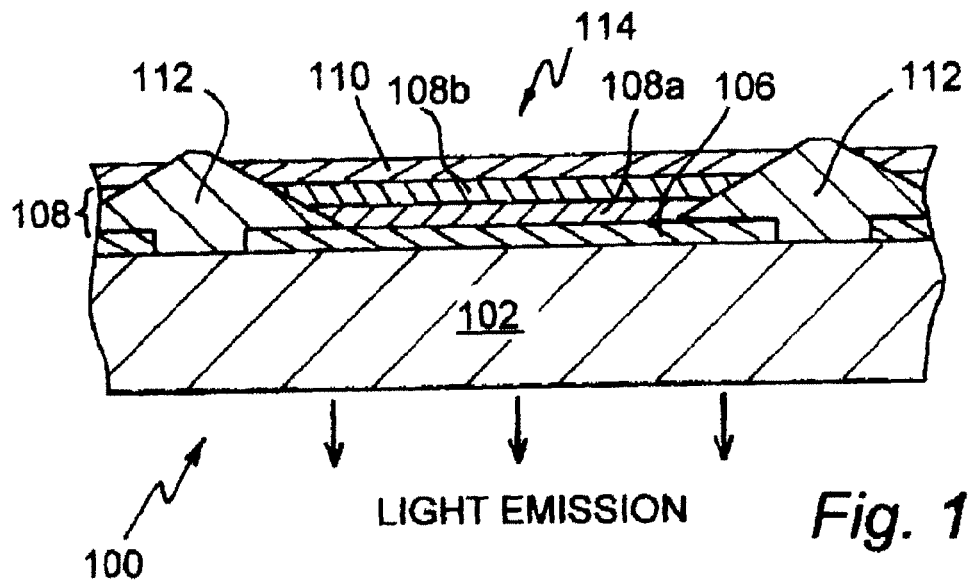
FIG. 1 shows a vertical cross section through an example of an OLED device.
Figure 2:
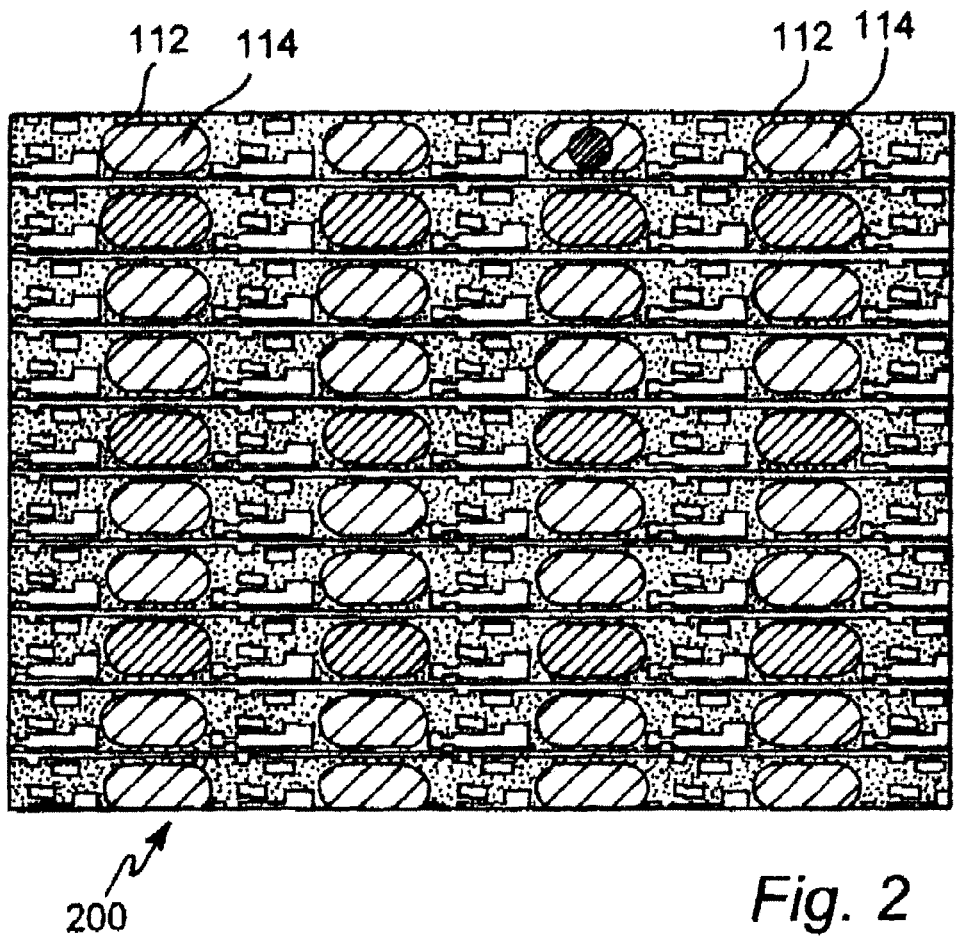
FIG. 2 shows a view from above of a portion of a three color pixelated OLED display.
Figure 3A:
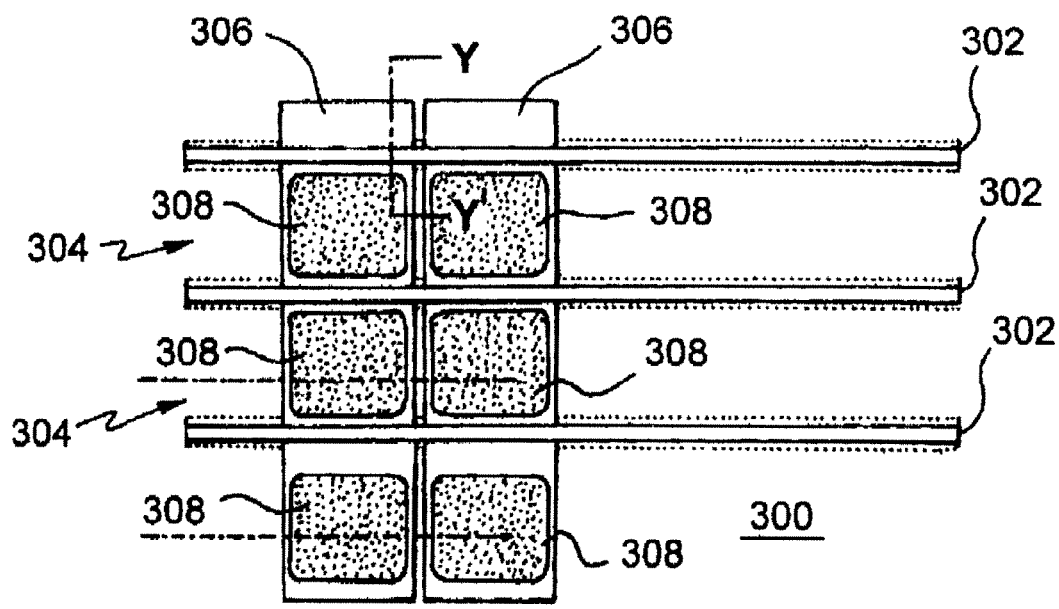
FIGS. 3a and 3b show a view from above and a cross-sectional view respectively of a passive matrix OLED display.
Figure 3B:
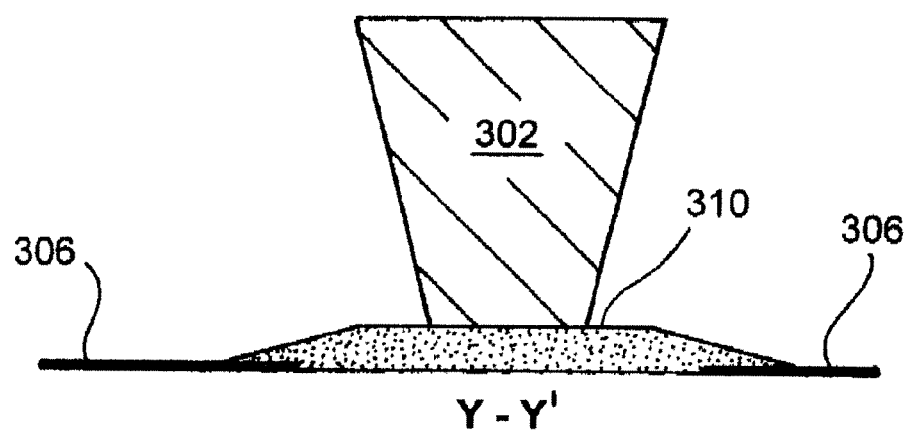
Figure 4A:
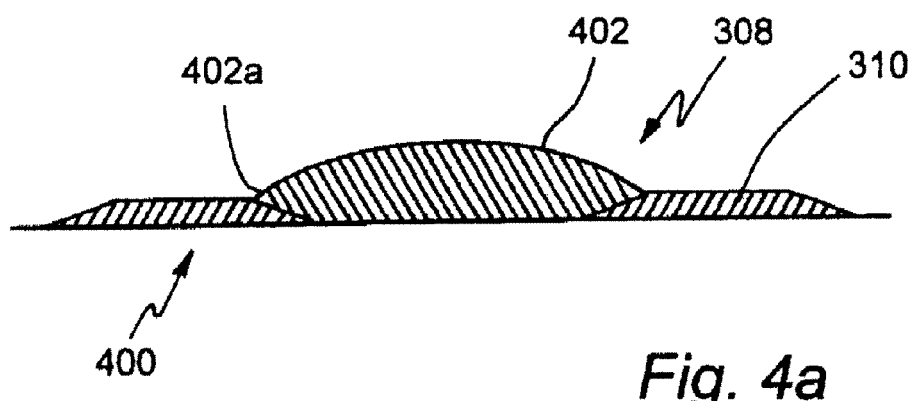
FIGS. 4a and 4b show a simplified cross section of a well of an OLED display substrate filled with, respectively, dissolved material, and dry material.
Figure 4B:
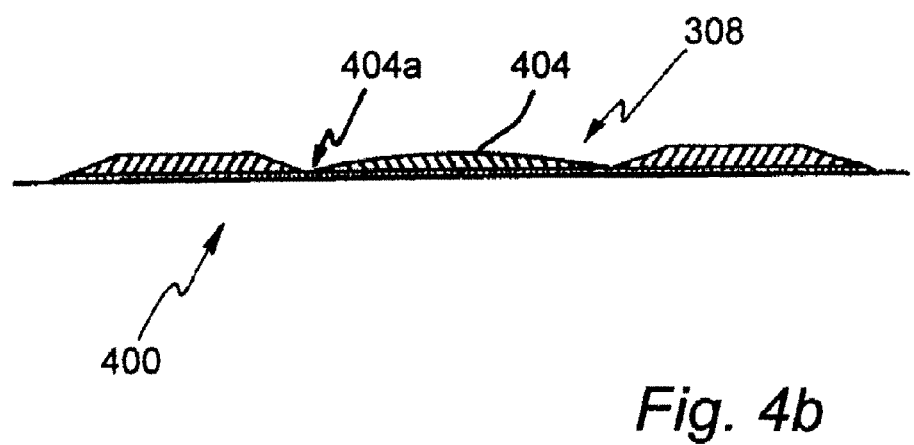

The architecture of an electroluminescent device according to the invention comprises a transparent glass or plastic substrate, an anode and a cathode. An electroluminescent layer is provided between the anode and the cathode.

In a practical device, at least one of the electrodes is semi-transparent in order that light may be absorbed (in the case of a photoresponsive device) or emitted (in the case of an OLED). Where the anode is transparent, it typically comprises indium tin oxide.

Charge Transport Layers

Further layers may be located between the anode and the cathode, such as charge transporting, charge injecting or charge blocking layers.

In particular, it is desirable to provide a conductive hole injection layer, which may be formed from a conductive organic or inorganic material provided between the anode and the electroluminescent layer to assist hole injection from the anode into the layer or layers of semiconducting polymer. Examples of doped organic hole injection materials include doped poly(ethylene dioxythiophene) (PEDT), in particular PEDT doped with a charge-balancing polyacid such as polystyrene sulfonate (PSS) as disclosed in EP 0901176 and EP 0947123, polyacrylic acid or a fluorinated sulfonic acid, for example Nafion®; polyaniline as disclosed in U.S. Pat. No. 5,723,873 and U.S. Pat. No. 5,798,170; and poly(thienothiophene). Examples of conductive inorganic materials include transition metal oxides such as $VO_x$, $MoO_x$ and $RuO_x$ as disclosed in Journal of Physics D: Applied Physics (1996), 29(11), 2750-2753.

If present, a hole transporting layer located between the anode and the electroluminescent layer preferably has a HOMO level of less than or equal to 5.5 eV, more preferably around 4.8-5.5 eV. HOMO levels may be measured by cyclic voltammetry, for example.

If present, an electron transporting layer located between the electroluminescent layer and the cathode preferably has a LUMO level of around 3-3.5 eV.

Electroluminescent Layer

The electroluminescent layer may consist of the electroluminescent material alone or may comprise the electroluminescent material in combination with one or more further materials. In particular, the electroluminescent material may be blended with hole and/or electron transporting materials as disclosed in, for example, WO 99/48160, or may comprise a luminescent dopant in a semi-conducting host matrix. Alternatively, the electroluminescent material may be covalently bound to a charge transporting material and/or host material.

The electroluminescent layer may be patterned or unpatterned. A device comprising an unpatterned layer may be used an illumination source, for example. A white light emitting device is particularly suitable for this purpose. A device comprising a patterned layer may be, for example, an active matrix display or a passive matrix display. In the case of an active matrix display, a patterned electroluminescent layer is typically used in combination with a patterned anode layer and an unpatterned cathode. In the case of a passive matrix display, the anode layer is formed of parallel stripes of anode material, and parallel stripes of electroluminescent material and cathode material arranged perpendicular to the anode material wherein the stripes of electroluminescent material and cathode material are typically separated by stripes of insulating material ("cathode separators") formed by photolithography.

Suitable materials for use in the electroluminescent layer include small molecule, polymeric and dendrimeric materials, and compositions thereof.

Cathode

The cathode is selected from materials that have a workfunction allowing injection of electrons into the electroluminescent layer. Other factors influence the selection of the cathode such as the possibility of adverse interactions between the cathode and the electroluminescent material. The cathode may consist of a single material such as a layer of aluminum. Alternatively, it may comprise a plurality of metals, for example a bilayer of a low workfunction material and a high workfunction material such as calcium and aluminum as disclosed in WO 98/10621; elemental barium as disclosed in WO 98/57381, Appl. Phys. Lett. 2002, 81(4), 634 and WO 02/84759; or a thin layer of metal compound, in particular an oxide or fluoride of an alkali or alkali earth metal, to assist electron injection, for example lithium fluoride as disclosed in WO 00/48258; barium fluoride as disclosed in Appl. Phys. Lett, 2001, 79(5), 2001; and barium oxide. In order to provide efficient injection of electrons into the device, the cathode preferably has a workfunction of less than 3.5 eV, more preferably less than 3.2 eV, most preferably less than 3 eV. Work functions of metals can be found in, for example, Michaelson, J. Appl. Phys. 48(11), 4729, 1977.

The cathode may be opaque or transparent. Transparent cathodes are particularly advantageous for active matrix devices because emission through a transparent anode in such devices is at least partially blocked by drive circuitry located underneath the emissive pixels. A transparent cathode will comprise a layer of an electron injecting material that is sufficiently thin to be transparent. Typically, the lateral conductivity of this layer will be low as a result of its thinness. In this case, the layer of electron injecting material is used in combination with a thicker layer of transparent conducting material such as indium tin oxide.

It will be appreciated that a transparent cathode device need not have a transparent anode (unless, of course, a fully transparent device is desired), and so the transparent anode used for bottom-emitting devices may be replaced or supplemented with a layer of reflective material such as a layer of aluminum. Examples of transparent cathode devices are disclosed in, for example, GB 2348316.

Encapsulation

Optical devices tend to be sensitive to moisture and oxygen. Accordingly, the substrate preferably has good barrier properties for prevention of ingress of moisture and oxygen into the device. The substrate is commonly glass, however alternative substrates may be used, in particular where flexibility of the device is desirable. For example, the substrate may comprise a plastic as in U.S. Pat. No. 6,268,695 which discloses a substrate of alternating plastic and barrier layers or a laminate of thin glass and plastic as disclosed in EP 0949850.

The device is preferably encapsulated with an encapsulant to prevent ingress of moisture and oxygen. Suitable encapsulants include a sheet of glass, films having suitable barrier properties such as alternating stacks of polymer and dielectric as disclosed in, for example, WO 01/81649 or an airtight container as disclosed in, for example, WO 01/19142. A getter material for absorption of any atmospheric moisture and/or oxygen that may permeate through the substrate or encapsulant may be disposed between the substrate and the encapsulant.

Other

The embodiment of FIG. 1 illustrates a device formed by firstly forming an anode on a substrate followed by deposition of an electroluminescent layer and a cathode, however it will be appreciated that the device of the invention could also be formed by firstly forming a cathode on a substrate followed by deposition of an electroluminescent layer and an anode.

Conjugated Polymers (Fluorescent and/or Charge Transporting)

Suitable electroluminescent and/or charge transporting polymers include poly(arylene vinylenes) such as poly(p-phenylene vinylenes) and polyarylenes.

Polymers preferably comprise a first repeat unit selected from arylene repeat units as disclosed in, for example, Adv. Mater. 2000 12(23) 1737-1750 and references therein. Exemplary first repeat units include: 1,4-phenylene repeat units as disclosed in J. Appl. Phys. 1996, 79, 934; fluorene repeat units as disclosed in EP 0842208; indenofluorene repeat units as disclosed in, for example, Macromolecules 2000, 33(6), 2016-2020; and spirofluorene repeat units as disclosed in, for example EP 0707020. Each of these repeat units is optionally substituted. Examples of substituents include solubilising groups such as C1-20 alkyl or alkoxy; electron withdrawing groups such as fluorine, nitro or cyano; and substituents for increasing glass transition temperature (Tg) of the polymer.

Particularly preferred polymers comprise optionally substituted, 2,7-linked fluorenes, most preferably repeat units of Formula 1:

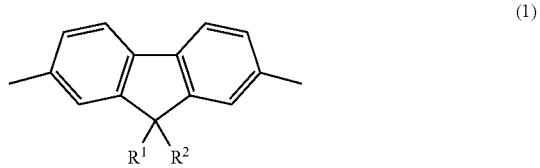

(1)

wherein $R^1$ and $R^2$ are independently selected from hydrogen or optionally substituted alkyl, alkoxy, aryl, arylalkyl, heteroaryl and heteroarylalkyl. More preferably, at least one of $R^1$ and $R^2$ comprises an optionally substituted $C_4$-$C_{20}$ alkyl or aryl group.

Polymers may provide one or more of the functions of hole transport, electron transport and emission depending on which layer of the device it is used in and the nature of co-repeat units.

A homopolymer of fluorene repeat units, such as a homopolymer of 9,9-dialkylfluoren-2,7-diyl, may be utilized to provide electron transport.

A copolymer may be provided comprising a triarylamine repeat unit, in particular a repeat unit 2:

(2)

wherein $Ar^1$ and $Ar^2$ are optionally substituted aryl or heteroaryl groups, n is greater than or equal to 1, preferably 1 or 2, and R is H or a substituent, preferably a substituent. R is preferably alkyl or aryl or heteroaryl, most preferably aryl or heteroaryl. Any of the aryl or heteroaryl groups in the unit of formula 2 may be substituted. Preferred substituents include alkyl and alkoxy groups. Any of the aryl or heteroaryl groups in the repeat unit of Formula 2 may be linked by a direct bond or a divalent linking atom or group. Preferred divalent linking atoms and groups include O, S; substituted N; and substituted C.

Particularly preferred units satisfying Formula 2 include units of Formulae 3-5:

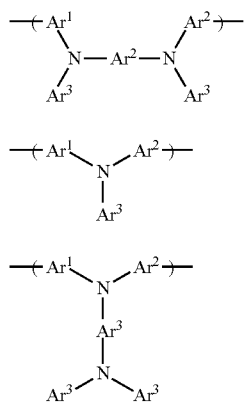

wherein $Ar^1$ and $Ar^2$ are as defined above; and $Ar^3$ is optionally substituted aryl or heteroaryl. Where present, preferred substituents for $Ar^3$ include alkyl and alkoxy groups.

Particularly preferred hole transporting polymers of this type are copolymers of the fluorene of formula 1 and the triarylamine of formula 2.

A copolymer comprising a first repeat unit and heteroarylene repeat unit may be utilised for charge transport or emission. Preferred heteroarylene repeat units are selected from formulae 7-21:

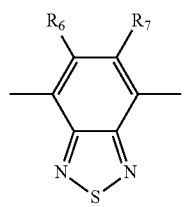

wherein $R_6$ and $R_7$ are the same or different and are each independently hydrogen or a substituent group, preferably alkyl, aryl, perfluoroalkyl, thioalkyl, cyano, alkoxy, heteroaryl, alkylaryl or arylalkyl. For ease of manufacture, $R_6$ and $R_7$ are preferably the same. More preferably, they are the same and are each a phenyl group.

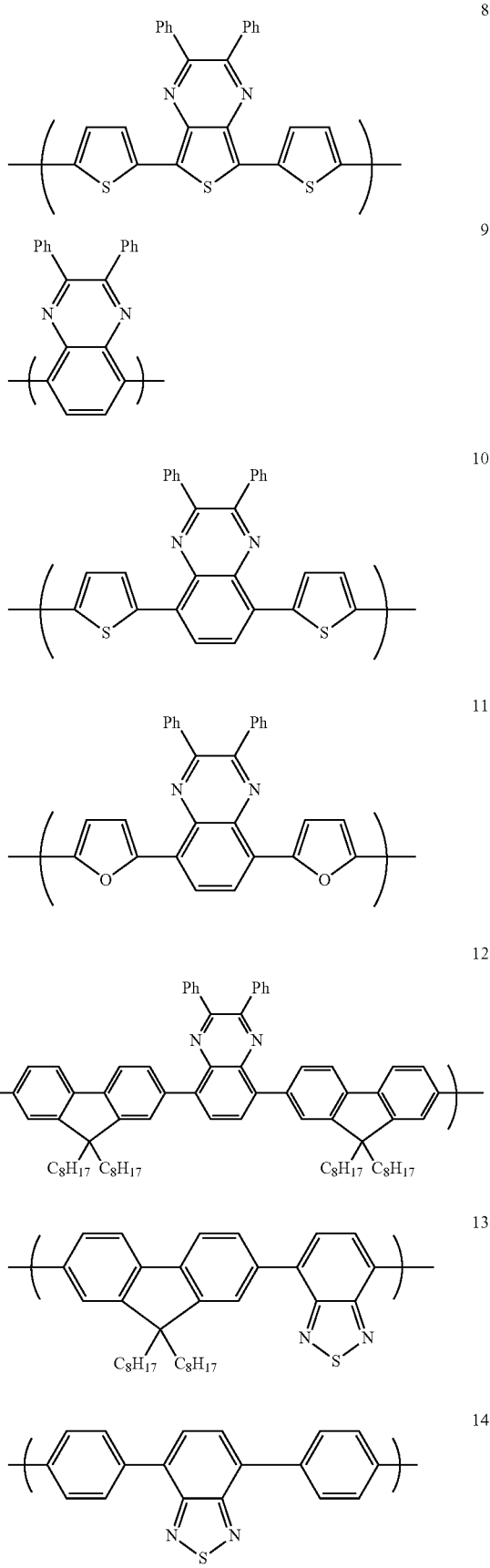

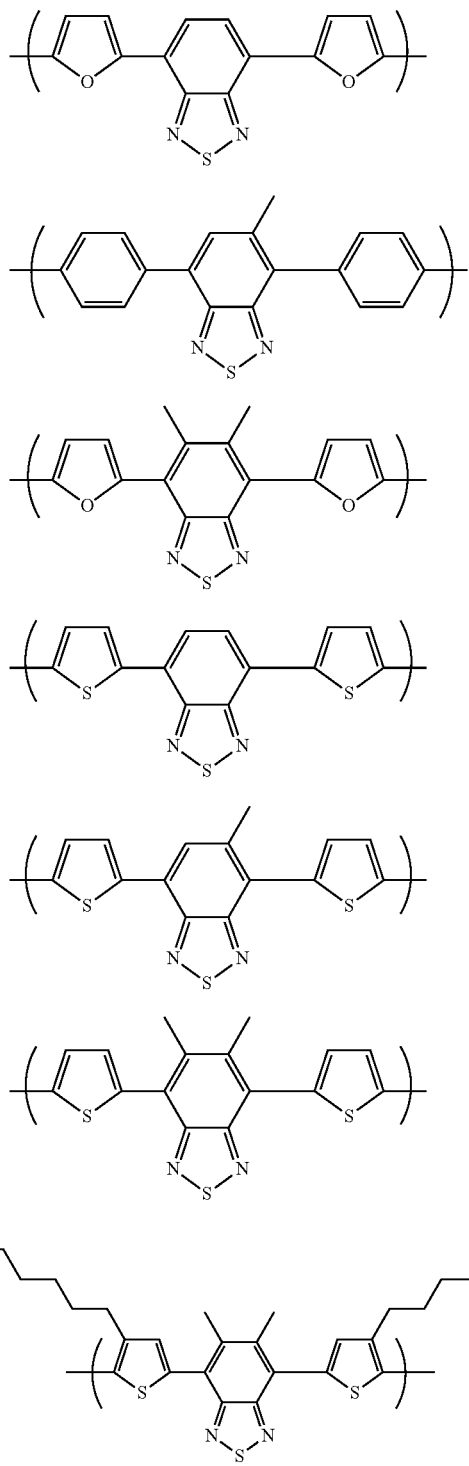

Electroluminescent copolymers may comprise an electroluminescent region and at least one of a hole transporting region and an electron transporting region as disclosed in, for example, WO 00/55927 and U.S. Pat. No. 6,353,083. If only one of a hole transporting region and electron transporting region is provided then the electroluminescent region may also provide the other of hole transport and electron transport functionality. Alternatively, an electroluminescent polymer may be blended with a hole transporting material and/or an electron transporting material. Polymers comprising one or more of a hole transporting repeat unit, electron transporting repeat unit and emissive repeat unit may provide said units in a polymer main-chain or polymer side-chain.

The different regions within such a polymer may be provided along the polymer backbone, as per U.S. Pat. No. 6,353,083, or as groups pendant from the polymer backbone as per WO 01/62869.

Polymerization Methods

Preferred methods for preparation of these polymers are Suzuki polymerization as described in, for example, WO 00/53656 and Yamamoto polymerization as described in, for example, T. Yamamoto, "Electrically Conducting And Thermally Stable π—Conjugated Poly(arylene)s Prepared by Organometallic Processes", Progress in Polymer Science 1993, 17, 1153-1205. These polymerization techniques both operate via a "metal insertion" wherein the metal atom of a metal complex catalyst is inserted between an aryl group and a leaving group of a monomer. In the case of Yamamoto polymerization, a nickel complex catalyst is used; in the case of Suzuki polymerization, a palladium complex catalyst is used.

For example, in the synthesis of a linear polymer by Yamamoto polymerization, a monomer having two reactive halogen groups is used. Similarly, according to the method of Suzuki polymerization, a least one reactive group is a boron derivative group such as a boronic acid or boronic ester and the other reactive group is a halogen. Preferred halogens are chlorine, bromine and iodine, most preferably bromine.

It will therefore be appreciated that repeat units and end groups comprising aryl groups as illustrated throughout this application may be derived from a monomer carrying a suitable leaving group.

Suzuki polymerization may be used to prepare regioregular, block and random copolymers. In particular, homopolymers or random copolymers may be prepared when one reactive group is a halogen and the other reactive group is a boron derivative group. Alternatively, block or regioregular, in particular AB, copolymers may be prepared when both reactive groups of a first monomer are boron and both reactive groups of a second monomer are halogen.

As alternatives to halides, other leaving groups capable of participating in metal insertion include groups include tosylate, mesylate and triflate.

Solution Processing

A single polymer or a plurality of polymers may be deposited from solution to form the electroluminescent layer. Particularly preferred solution deposition techniques are spin-coating and inkjet printing.

Spin-coating is particularly suitable for devices wherein patterning of the electroluminescent material is unnecessary—for example for lighting applications or simple monochrome segmented displays.

Inkjet printing is particularly suitable for high information content displays, in particular full color displays. Inkjet printing of OLEDs is described in, for example, EP 0880303.

Other solution deposition techniques include nozzle printing, spray coating, dip-coating, roll printing and screen printing.

If multiple layers of the device are formed by solution processing then the skilled person will be aware of techniques to prevent intermixing of adjacent layers, for example by crosslinking of one layer before deposition of a subsequent layer or selection of materials for adjacent layers such that the material from which the first of these layers is formed is not soluble in the solvent used to deposit the second layer.

Emission Colors

By "red electroluminescent material" is meant an organic material that by electroluminescence emits radiation having a wavelength in the range of 600-750 nm, preferably 600-700 nm, more preferably 610-650 nm and most preferably having an emission peak around 650-660 nm.

By "green electroluminescent material" is meant an organic material that by electroluminescence emits radiation having a wavelength in the range of 510-580 nm, preferably 510-570 nm.

By "blue electroluminescent material" is meant an organic material that by electroluminescence emits radiation having a wavelength in the range of 400-500 nm, more preferably 430-500 nm.

Hosts for Phosphorescent Emitters

Numerous hosts are described in the prior art including "small molecule" hosts such as 4,4'-bis(carbazol-9-yl)biphenyl), known as CBP, and (4,4',4"-tris(carbazol-9-yl)triphenylamine), known as TCTA, disclosed in Ikai et al., Appl. Phys. Lett., 79 no. 2, 2001, 156, and triarylamines such as tris-4-(N-3-methylphenyl-N-phenyl)phenylamine, known as MTDATA. Polymers are also known as hosts, in particular homopolymers such as poly(vinyl carbazole) disclosed in, for example, Appl. Phys. Lett. 2000, 77(15), 2280, polyfluorenes in Synth. Met. 2001, 116, 379, Phys. Rev. B 2001, 63, 235206 and Appl. Phys. Lett. 2003, 82(7), 1006, poly[4-(N-4-vinylbenzyloxyethyl, N-methylamino)-N-(2,5-di-tert-butylphenylnapthalimide] in Adv. Mater. 1999, 11(4), 285, and poly (para-phenylenes) in J. Mater. Chem. 2003, 13, 50-55. Copolymers are also known as hosts.

Metal Complexes

Preferred metal complexes comprise optionally substituted complexes of formula (22):

wherein M is a metal; each of $L^1$, $L^2$ and $L^3$ is a coordinating group; q is an integer; r and s are each independently 0 or an integer; and the sum of $(a \cdot q)+(b \cdot r)+(c \cdot s)$ is equal to the number of coordination sites available on M, wherein a is the number of coordination sites on $L^1$, b is the number of coordination sites on $L^2$ and c is the number of coordination sites on $L^3$.

Heavy elements M induce strong spin-orbit coupling to allow rapid intersystem crossing and emission from triplet or higher states (phosphorescence).

Suitable heavy metals M include:
 lanthanide metals such as cerium, samarium, europium, terbium, dysprosium, thulium, erbium and neodymium; and
 d-block metals, in particular those in rows 2 and 3 i.e. elements 39 to 48 and 72 to 80, in particular ruthenium, rhodium, palladium, rhenium, osmium, iridium, platinum and gold.
 Suitable coordinating groups for the f-block metals include oxygen or nitrogen donor systems such as carboxylic acids, 1,3-diketonates, hydroxy carboxylic acids,
 Schiff bases including acyl phenols and iminoacyl groups. As is known, luminescent lanthanide metal complexes require sensitizing group(s) which have the triplet excited energy level higher than the first excited state of the metal ion. Emission is from an f-f transition of the metal and so the emission color is determined by the choice of the metal. The sharp emission is generally narrow, resulting in a pure color emission useful for display applications.

The d-block metals are particularly suitable for emission from triplet excited states. These metals form organometallic complexes with carbon or nitrogen donors such as porphyrin or bidentate ligands of formula (23):

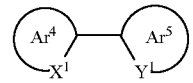

wherein $Ar^4$ and $Ar^5$ may be the same or different and are independently selected from optionally substituted aryl or heteroaryl; $X^1$ and $Y^1$ may be the same or different and are independently selected from carbon or nitrogen; and $Ar^4$ and $Ar^5$ may be fused together. Ligands wherein $X^1$ is carbon and $Y^1$ is nitrogen are particularly preferred.

Examples of bidentate ligands are illustrated below:

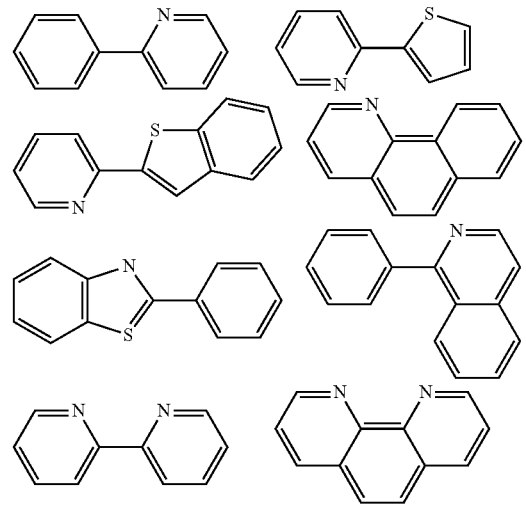

Each of $Ar^4$ and $Ar^5$ may carry one or more substituents. Two or more of these substituents may be linked to form a ring, for example an aromatic ring. Particularly preferred substituents include fluorine or trifluoromethyl which may be used to blue-shift the emission of the complex as disclosed in WO 02/45466, WO 02/44189, US 2002-117662 and US 2002-182441; alkyl or alkoxy groups as disclosed in JP 2002-324679; carbazole which may be used to assist hole transport to the complex when used as an emissive material as disclosed in WO 02/81448; bromine, chlorine or iodine which can serve to functionalise the ligand for attachment of further groups as disclosed in WO 02/68435 and EP 1245659; and dendrons which may be used to obtain or enhance solution processability of the metal complex as disclosed in WO 02/66552.

A light-emitting dendrimer typically comprises a light-emitting core bound to one or more dendrons, wherein each dendron comprises a branching point and two or more dendritic branches. Preferably, the dendron is at least partially conjugated, and at least one of the core and dendritic branches comprises an aryl or heteroaryl group. Other ligands suitable for use with d-block elements include diketonates, in particular acetylacetonate (acac); triarylphosphines and pyridine, each of which may be substituted.

Main group metal complexes show ligand based, or charge transfer emission. For these complexes, the emission color is determined by the choice of ligand as well as the metal.

The host material and metal complex may be combined in the form of a physical blend. Alternatively, the metal complex may be chemically bound to the host material. In the case of a polymeric host, the metal complex may be chemically bound as a substituent attached to the polymer backbone, incorporated as a repeat unit in the polymer backbone or provided as an end-group of the polymer as disclosed in, for example, EP 1245659, WO 02/31896, WO 03/18653 and WO 03/22908.

A wide range of fluorescent low molecular weight metal complexes are known and have been demonstrated in organic light emitting devices [see, e.g., Macromol. Sym. 125 (1997) 1-48, U.S. Pat. No. 5,150,006, U.S. Pat. No. 6,083,634 and U.S. Pat. No. 5,432,014]. Suitable ligands for di or trivalent metals include: oxinoids, e. g. with oxygen-nitrogen or oxygen-oxygen donating atoms, generally a ring nitrogen atom with a substituent oxygen atom, or a substituent nitrogen atom or oxygen atom with a substituent oxygen atom such as 8-hydroxyquinolate and hydroxyquinoxalinol-10-hydroxybenzo (h) quinolinato (II), benzazoles (Ill), schiff bases, azoindoles, chromone derivatives, 3-hydroxyflavone, and carboxylic acids such as salicylato amino carboxylates and ester carboxylates. Optional substituents include halogen, alkyl, alkoxy, haloalkyl, cyano, amino, amido, sulfonyl, carbonyl, aryl or heteroaryl on the (hetero) aromatic rings which may modify the emission color.

Composition Formation Procedure

A red-emitting composition according to one embodiment of the present invention was prepared by blending a polymer comprising fluorene repeat units and amine repeat units (as per the previous description) and a red phosphorescent iridium complex (total solid content of 0.9% by weight) in a solvent system comprising butyl benzoate (40% by volume), methyl benzoate (40% by volume) and 4-methyl anisole (20% by volume). For comparison a red-emitting composition not according to the present invention was prepared in the same manner but using a solvent system comprising cyclohexylbenzene (50% by volume) and 4-methyl anisole (50% by volume).

A white-emitting composition according to one embodiment of the present invention was prepared by blending a polymer as described in GB 0801227.0 comprising green fluorescent units and blue fluorescent units encapped with a red phosphorescent iridium complex (total solid content of 0.8% by weight) in a solvent system comprising butyl benzoate (40% by volume), methyl benzoate (40% by volume) and 4-methyl anisole (20% by volume). For comparison a white-emitting composition not according to the present invention was prepared in the same manner but using a solvent system comprising cyclohexylbenzene (50% by volume) and 4-methyl anisole (50% by volume).

Device Manufacturing Procedure

The procedure follows the steps outlined below:
1) Depositing a PEDT/PSS composition onto indium tin oxide supported on a glass substrate (available from Applied Films, Colorado, USA) by spin coating.
2) Depositing a layer of hole transporting polymer by spin coating from xylene solution having a concentration of 2% w/v.
3) Heating the layer of hole transport material in an inert (nitrogen) environment.
4) Optionally spin-rinsing the substrate in xylene to remove any remaining soluble hole transport material.
5) Depositing an organic light-emissive composition according to the present invention by ink-jet printing.
6) Depositing a metal compound/conductive material bilayer cathode over the organic light-emissive material and encapsulating the device using an airtight metal enclosure available from Saes Getters SpA.

Full Color Display Manufacturing Procedure

A full color display can be formed according to the process described in EP 0880303 by forming wells for red, green and blue subpixels using standard lithographical techniques; inkjet printing PEDT/PSS into each subpixel well; inkjet printing hole transport material; and inkjet printing red, green and blue electroluminescent materials into wells for red, green and blue subpixels respectively. A white emissive subpixel may also be provided.

Sample Experimental Results

Results for the aforementioned red and white emissive compositions are given in Tables 1 and 2 respectively. The tables illustrate the percentage of nozzles which operate outside the specified jetting angle for the embodiments and the comparative examples.

As can be seen from the tables, the embodiments of the present invention have a significantly better jetting directionality than the comparative examples.

TABLE 1

| | 20 mRads | Red Polymer 15 mRads Comparative Example | 10 mRads | 20 mRads | Red Polymer 15 mRads Embodiment | 10 mRads |
|---|---|---|---|---|---|---|
| % Nozzles out of spec at 2 kHz, 20 mins | 3.9% | 5.5% | 10.9% | 0.8% | 1.5% | 1.5% |

TABLE 2

| | 20 mRads | White Polymer 15 mRads Comparative Example | 10 mRads | 20 mRads | White Polymer 15 mRads Embodiment | 10 mRads |
|---|---|---|---|---|---|---|
| % Nozzles out of spec at 2 kHz, 10 mins | 3.1% | 7.8% | 17.2% | 0% | 0% | 0.8% |

The invention claimed is:

1. A composition adapted for use in the manufacture of an organic light-emissive device by passing the composition through one or more openings under pressure to deposit the composition, the composition comprising: a semi-conductive organic host material; a luminescent metal complex; and solvent components, said solvent components consisting of methyl benzoate, butyl benzoate, and methylanisole.

2. A composition according to claim 1, wherein the luminescent metal complex is a transition metal complex.

3. A composition according to claim 1, wherein the luminescent metal complex is a phosphorescent metal complex.

4. A composition according to claim 1, wherein the luminescent metal complex is an iridium complex.

5. A composition according to claim 1, wherein the luminescent metal complex is bonded to the semi-conductive organic host material.

6. A composition according to claim 1, wherein the luminescent metal complex is mixed with the semi-conductive organic host material in a blend.

7. A composition according to claim 1, wherein the semiconductive organic host material comprises one or more emissive units having a different color than the luminescent metal complex.

8. A composition according to claim 7, wherein the one or more emissive units are fluorescent.

9. A composition according to claim 8, wherein the one or more emissive units comprise a green fluorescent unit and a blue fluorescent unit and the luminescent metal complex is a phosphorescent red emissive unit thereby forming a white emissive composition.

10. A composition according to claim 1, comprising a total solid content in the range 0.001 to 5% by weight.

11. A composition according to claim 10, wherein the total solid content comprises 0.001 to 50% by weight of the luminescent metal complex.

12. A composition according to claim 1, wherein the composition has a viscosity in the range 1 to 20 cP.

13. A composition according to claim 1, wherein the composition has a surface tension in the range 28 to 40 mNm$^{-1}$.

14. A composition according to claim 1, wherein the semiconductive organic host material has a molecular weight in the range 250,000 to 350,000 Daltons.

15. A composition according to claim 1, wherein the semiconductive organic host material comprises a semi-conductive polymer.

16. A composition according to claim 1, comprising a total solid content in the range 0.6 to 1.4% by weight.

17. A composition according to claim 10, wherein the total solid content comprises 0.001 to 30% by weight of the luminescent metal complex.

18. A composition according to claim 10, wherein the total solid content comprises 0.001 to 20% by weight of the luminescent metal complex.

19. A composition according to claim 1, wherein the composition has a viscosity in the range 3 to 10 cP.

20. A composition according to claim 1, wherein the composition has a surface tension in the range 30 to 35 mNm$^{-1}$.

21. A method of manufacturing a light-emissive device, the method comprising:
  depositing a first electrode for injecting charge of a first polarity;
  depositing a light-emissive layer; and
  depositing a second electrode for injecting charge of a second polarity opposite to said first polarity,
  wherein the light-emissive layer is deposited by passing the composition according to claim 1 through one or more openings under pressure.

22. A method according to claim 21, wherein the composition is deposited by ink-jet printing, nozzle printing, or spray coating.

23. A method according to claim 21, wherein jetting frequency is in the range 500 Hz to 10 KHz.

24. A method according to claim 21, wherein jetting frequency is in the range 4 to 6 KHz.

* * * * *